United States Patent
Yasuda et al.

(10) Patent No.: US 10,074,626 B2
(45) Date of Patent: Sep. 11, 2018

(54) WAFER LAMINATE AND MAKING METHOD

(71) Applicant: Shin-Etsu Chemical Co., Ltd., Tokyo (JP)

(72) Inventors: Hiroyuki Yasuda, Annaka (JP); Michihiro Sugo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/596,146

(22) Filed: May 16, 2017

(65) Prior Publication Data

US 2017/0352637 A1 Dec. 7, 2017

(30) Foreign Application Priority Data

Jun. 6, 2016 (JP) ................. 2016-112828

(51) Int. Cl.
*H01L 23/48* (2006.01)
*H01L 23/00* (2006.01)
(Continued)

(52) U.S. Cl.
CPC .............. *H01L 24/29* (2013.01); *B32B 7/12* (2013.01); *B32B 37/1207* (2013.01); *B32B 37/1284* (2013.01); *C08G 8/04* (2013.01); *C08G 8/28* (2013.01); *C08G 77/42* (2013.01); *C09J 5/06* (2013.01); *C09J 7/35* (2018.01); *C09J 9/00* (2013.01); *C09J 161/14* (2013.01); *C09J 183/10* (2013.01); *H01L 21/6835* (2013.01); *H01L 21/76898* (2013.01); *H01L 24/27* (2013.01); *B32B 2037/1253* (2013.01); *B32B 2250/02* (2013.01); *B32B 2255/26* (2013.01); *B32B 2255/28* (2013.01); *B32B 2305/72* (2013.01); *B32B 2325/00* (2013.01); *B32B 2363/00* (2013.01); *B32B 2383/00* (2013.01);
(Continued)

(58) Field of Classification Search
CPC ........ H01L 24/29; H01L 21/6835; C09J 7/35; C09J 183/10; B32B 7/12; B32B 37/1207; B32B 37/1284; C08G 77/42
USPC ........................................ 257/783
See application file for complete search history.

(56) References Cited

U.S. PATENT DOCUMENTS

| 5,702,800 A | * | 12/1997 | Mihayashi | ............... B24D 3/28 360/128 |
| 2003/0064305 A1 | | 4/2003 | Ono et al. | |

(Continued)

FOREIGN PATENT DOCUMENTS

| EP | 3 174 091 A1 | 5/2017 |
| JP | 2003-177528 A | 6/2003 |

(Continued)

OTHER PUBLICATIONS

Extended Search Report dated Oct. 24, 2017, issued in counterpart European Application No. 17174227.3 (8 pages).

*Primary Examiner* — Nitin Parekh
(74) *Attorney, Agent, or Firm* — Westerman, Hattori, Daniels & Adrian, LLP

(57) ABSTRACT

A wafer laminate has an adhesive layer (2) sandwiched between a support (1) and a wafer (3), with a circuit-forming surface of the wafer facing the adhesive layer. The adhesive layer (2) includes a light-shielding resin layer (2a), an epoxy-containing siloxane skeleton resin layer (2b), and a non-silicone thermoplastic resin layer (2c).

7 Claims, 1 Drawing Sheet

(51) Int. Cl.
*B32B 7/12* (2006.01)
*B32B 37/12* (2006.01)
*C08G 8/04* (2006.01)
*C08G 8/28* (2006.01)
*C08G 77/42* (2006.01)
*C09J 5/06* (2006.01)
*C09J 9/00* (2006.01)
*C09J 161/14* (2006.01)
*C09J 183/10* (2006.01)
*H01L 21/768* (2006.01)
*H01L 21/683* (2006.01)
*C09J 7/35* (2018.01)

(52) U.S. Cl.
CPC ....... *B32B 2386/00* (2013.01); *B32B 2457/14* (2013.01); *C09J 2203/326* (2013.01); *C09J 2461/00* (2013.01); *C09J 2483/00* (2013.01); *H01L 2221/6834* (2013.01); *H01L 2221/68327* (2013.01); *H01L 2221/68381* (2013.01)

(56) References Cited

U.S. PATENT DOCUMENTS

| | | | | |
|---|---|---|---|---|
| 2006/0234154 A1* | 10/2006 | Nishimura | ............ | G03F 7/0046 430/270.1 |
| 2008/0176167 A1* | 7/2008 | Kawamori | ............ | C09J 179/08 430/271.1 |
| 2012/0248634 A1* | 10/2012 | Mitsukura | ............ | H01L 21/6836 257/798 |
| 2012/0302676 A1* | 11/2012 | Oya | ............ | C08J 5/18 524/89 |
| 2013/0011617 A1* | 1/2013 | Tasaki | ............ | B29C 45/14 428/148 |
| 2013/0087959 A1 | 4/2013 | Tran et al. | | |
| 2013/0340829 A1* | 12/2013 | Hatakeyama | ....... | H01L 31/0481 136/259 |
| 2014/0322478 A1* | 10/2014 | Mori | ............ | H01L 51/5246 428/76 |
| 2015/0219810 A1* | 8/2015 | Taka | ............ | G02B 5/0841 359/584 |
| 2015/0336324 A1* | 11/2015 | Mizukami | ............ | B29C 59/04 156/187 |
| 2016/0289519 A1 | 10/2016 | Yasuda et al. | | |
| 2016/0300969 A1* | 10/2016 | Yamakawa | ............ | C09J 183/04 |
| 2016/0370646 A1* | 12/2016 | Nishiyama | ............ | G03F 7/11 |
| 2017/0154801 A1 | 6/2017 | Tagami et al. | | |

FOREIGN PATENT DOCUMENTS

JP       2013-534721 A    9/2013
WO      2015/072418 A1    5/2015

* cited by examiner

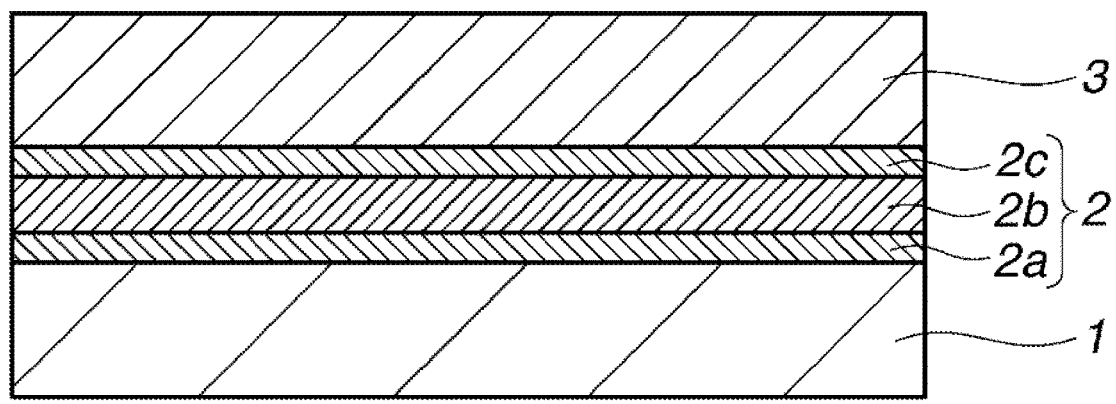

WAFER LAMINATE AND MAKING METHOD

CROSS-REFERENCE TO RELATED APPLICATION

This non-provisional application claims priority under 35 U.S.C. § 119(a) on Patent Application No. 2016-112828 filed in Japan on Jun. 6, 2016, the entire contents of which are hereby incorporated by reference.

TECHNICAL FIELD

This invention relates to a wafer laminate in the semiconductor field, and a method for preparing the wafer laminate.

BACKGROUND ART

Three-dimensional semiconductor packages become essential for a higher density and capacity. The 3D semiconductor packaging technology is by thinning semiconductor chips, and stacking them in multilayer structure while providing through-silicon via (TSV) interconnects. Fabrication of such packages requires the steps of thinning a substrate having a semiconductor circuit formed therein by grinding its non-circuit forming surface or back surface, and forming TSV and electrodes on the back surface. In the prior art, prior to the step of grinding the back surface of a silicon substrate, a protective tape is attached to the surface of the substrate opposite to the surface to be ground for preventing the wafer from breakage during the grinding step. Since the protective tape is based on an organic resin film, it is flexible, but has insufficient strength and heat resistance to withstand the TSV forming step and the step of forming interconnects on the back surface.

It is then proposed to bond a semiconductor substrate to a support of silicon or glass, for example, via an adhesive layer. The resulting system is sufficient to withstand the steps of grinding the back surface and forming TSV and electrodes on the back surface. The adhesive layer for bonding the substrate to the support is critical for this system. The adhesive layer must bond the substrate to the support without leaving gaps, be durable enough to withstand the subsequent steps, and eventually allow the thin wafer to be readily released from the support. The adhesive layer is referred herein to as "temporary adhesive layer" since it is finally removed.

While the temporary adhesive layers and removal thereof are well known, Patent Document 1 discloses a layer of an adhesive composition comprising a heat melting hydrocarbon compound, wherein the layer can be bonded and released in the heat molten state. This technology is simple because of mere thermal control, but is applicable to a limited range because of instability at high temperatures in excess of 200° C.

Patent Document 2 discloses the use of a silicone pressure-sensitive adhesive as the temporary adhesive layer. A substrate is bonded to a support via an addition curable silicone adhesive composition. On removal, the assembly is immersed in an etching solution capable of dissolving or decomposing the silicone resin, whereby the substrate is separated from the support. This method takes a very long time for removal and is difficult to apply to the commercial manufacture process.

On the other hand, Patent Document 3 describes an adhesive layer containing a photo-absorptive substance. The adhesive layer is separated from the support by irradiating high-intensity light to the adhesive layer for decomposing it. Although the processing time per substrate upon removal of the substrate from the support is short, this method must use a metal compound for converting the irradiated light to heat, leaving a risk of contaminating the substrate with the metal.

CITATION LIST

Patent Document 1: JP-A 2003-177528
Patent Document 2: WO 2015/072418
Patent Document 3: JP-A 2013-534721

SUMMARY OF INVENTION

An object of the invention is to provide a wafer laminate which facilitates to establish a bond between a wafer and a support, enables to form an adhesive layer of uniform thickness even on a heavily stepped wafer, is compatible with the TSV forming and back surface interconnect forming steps, has resistance to wafer thermal processing such as chemical vapor deposition (CVD), allows for easy removal of the wafer from the support, and offers high productivity in the manufacture of thin wafers. Another object is to provide a method for preparing the wafer laminate and a method for preparing a thin wafer.

The inventors have found that the above and other objects are attained by a wafer laminate in which a wafer is bonded to a support via an adhesive layer of specific construction.

In one aspect, the invention provides a wafer laminate comprising a support, an adhesive layer formed on the support, and a wafer disposed on the adhesive layer, with a circuit-forming surface of the wafer facing the adhesive layer. The adhesive layer includes a resin layer (A) having light-shielding properties, a resin layer (B), and a resin layer (C) comprising a non-silicone thermoplastic resin, stacked on the support in order. The resin layer (B) is a cured product of a resin composition (B) comprising a resin containing a siloxane skeleton and an epoxy group, the cured product having a resin modulus of 10 to 1,000 MPa.

In a preferred embodiment, the non-silicone thermoplastic resin has a glass transition temperature of −80° C. to 120° C.

In a preferred embodiment, the resin layer (A) has a transmittance of up to 20% with respect to light of wavelength 500 nm.

In a preferred embodiment, the resin layer (A) is a cured product of a resin composition (A) comprising a resin (A) comprising repeating units of the formula (1) and having a weight average molecular weight of 500 to 500,000.

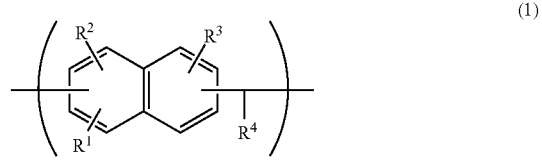

Herein $R^1$ to $R^3$ are each independently hydrogen, hydroxyl, or a $C_1$-$C_{20}$ monovalent organic group, at least one of $R^1$ to $R^3$ being hydroxyl, and $R^4$ is hydrogen or an optionally substituted $C_1$-$C_{30}$ monovalent organic group.

In a more preferred embodiment, the resin composition (A) further contains a crosslinker, an acid generator, and/or an organic solvent.

In a preferred embodiment, the resin composition (B) is a composition comprising 100 parts by weight of an epoxy-modified silicone resin comprising repeating units of the formula (2) and optionally repeating units of the formula (3), having a weight average molecular weight of 3,000 to 500,000, and 0.1 to 50 parts by weight of at least one crosslinker selected from phenol compounds having on average at least two phenol groups per molecule and epoxy compounds having on average at least two epoxy groups per molecule.

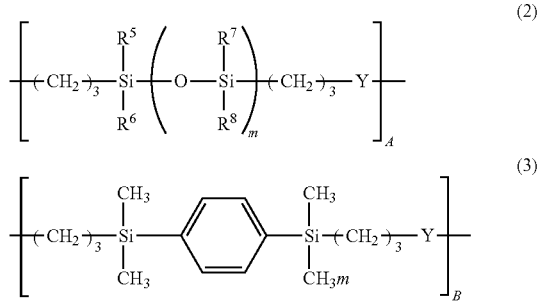

Herein $R^5$ to $R^8$ are each independently a $C_1$-$C_8$ monovalent hydrocarbon group, m is an integer of 1 to 100, A and B are numbers in the range: $0<A\leq 1$, $0\leq B\leq 1$, and $A+B=1$, Y is a divalent organic group having the formula (4):

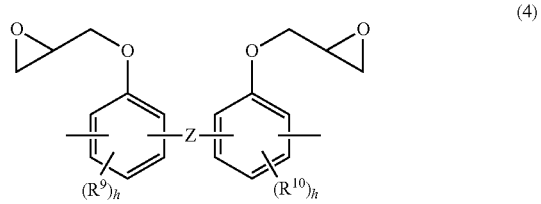

wherein Z is a single bond or a divalent organic group selected from the following:

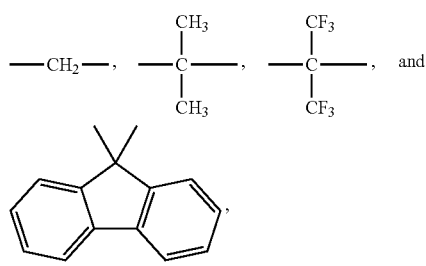

$R^9$ and $R^{10}$ each are $C_1$-$C_4$ alkyl or alkoxy, and h is 0, 1 or 2.

In another aspect, the invention provides a method for preparing the wafer laminate defined above, comprising the steps of:

(a) forming the resin layer (A) having light-shielding properties or a resin composition layer (A') for forming the resin layer (A) directly on the support, (b) forming the non-silicone thermoplastic resin layer (C) on the circuit-forming surface of the wafer, (c) forming a resin composition layer (B') for forming the resin layer (B) on the resin layer (A) or resin composition layer (A'), (d) bonding the resin composition layer (B') and the non-silicone thermoplastic resin layer (C) under a reduced pressure, and (e) heat curing the resin composition layer (B') to form the resin layer (B) and to bond it to the resin layer (A), or when the resin composition layer (A') is used, simultaneously heat curing the resin composition layer (A') and the resin composition layer (B') to form the resin layers (A) and (B) and bond them together.

In a further aspect, the invention provides a method for preparing the wafer laminate defined above, comprising the steps of:

(a) forming the resin layer (A) having light-shielding properties or a resin composition layer (A') for forming the resin layer (A) directly on the support, (b) forming the non-silicone thermoplastic resin layer (C) on the circuit-forming surface of the wafer, (c') forming a resin composition layer (B') for forming the resin layer (B) on the resin layer (C), (d') bonding the resin layer (A) or resin composition layer (A') on the support and the resin composition layer (B') under a reduced pressure, and (e) heat curing the resin composition layer (B') to form the resin layer (B) and to bond it to the resin layer (A), or when the resin composition layer (A') is used, simultaneously heat curing the resin composition layer (A') and the resin composition layer (B') to form the resin layers (A) and (B) and bond them together.

In a still further aspect, the invention provides a method for preparing a thin wafer, comprising the step of grinding or polishing a non-circuit-forming surface of the wafer of the wafer laminate obtained by the method defined above.

Advantageous Effects of Invention

The wafer laminate includes an adhesive layer which establishes a tight bond between support and wafer, has heat resistance, and allows for easy separation between support and wafer.

BRIEF DESCRIPTION OF DRAWING

FIGURE is a schematic view of a wafer laminate in one embodiment of the invention.

DESCRIPTION OF PREFERRED EMBODIMENT

The notation (Cn-Cm) means a group containing from n to m carbon atoms per group. As used herein, Mw is a weight average molecular weight as measured versus polystyrene standards by gel permeation chromatography (GPC) using THF solvent.

Wafer Laminate

One embodiment of the invention is a wafer laminate comprising a support, an adhesive layer formed on the support, and a wafer disposed on the adhesive layer, with a circuit-forming surface of the wafer facing the adhesive layer. The adhesive layer includes a resin layer (A) having light-shielding properties, a resin layer (B) comprising a resin containing a siloxane skeleton and an epoxy group, and a non-silicone thermoplastic resin layer (C) stacked on the support in the described order.

Referring to the structure of the wafer laminate, FIGURE illustrates that a support 1 and a wafer 3 are bonded via an adhesive layer 2. The adhesive layer 2 includes three layers: a resin layer 2a formed contiguous to the support 1, a resin layer 2b formed contiguous to the layer 2a, and a resin layer 2c formed contiguous to the layer 2b.

Support

The support may be selected from transparent substrates, silicon wafers, and ceramic substrates, though not limited thereto. Of these, transparent substrates are preferable from the standpoint of transmission of laser light which is irradiated upon removal of the support. Suitable transparent substrates include glass substrates and quartz substrates and preferably have a thickness of 300 to 1,000 μm, more preferably 500 to 800 μm.

Wafer

The wafer has a pair of opposed surfaces, that is, a front surface where a semiconductor circuit is formed and a back surface where a semiconductor circuit is not formed. The wafer is typically a semiconductor wafer. Suitable semiconductor wafers include silicon wafers, germanium wafers, gallium-arsenic wafers, gallium-phosphorus wafers, and gallium-arsenic-aluminum wafers. Although the thickness of the wafer is not particularly limited, it is preferably 600 to 800 μm, more preferably 625 to 775 μm.

Resin Layer (A)

The resin layer (A) is a resin layer having light-shielding properties, i.e., light-shielding layer, preferably having substantial absorption at wavelength of 500 nm or shorter. To ensure advantages such as heat resistance, adhesion and chemical resistance, the resin layer (A) is preferably a cured product of a resin composition (A) comprising a resin (A) comprising repeating units having the formula (1). The repeating units having formula (1) may be of one type or two or more types.

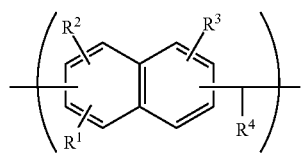

(1)

In formula (1), $R^1$ to $R^3$ are each independently hydrogen, hydroxyl, or a $C_1$-$C_{20}$, preferably $C_1$-$C_{10}$ monovalent organic group, at least one of $R^1$ to $R^3$ being hydroxyl. Suitable monovalent organic groups include straight, branched or cyclic alkyl groups such as methyl, ethyl, n-propyl, isopropyl, n-butyl, sec-butyl, t-butyl, n-pentyl, neopentyl, n-hexyl, n-heptyl, n-octyl, n-nonyl, n-decyl, n-dodecyl, n-pentadecyl, n-icosyl, cyclopentyl, cyclohexyl, cyclopentylmethyl, cyclohexylmethyl, cyclopentylethyl, cyclohexylethyl, cyclopentylbutyl, cyclohexylbutyl and adamantyl, alkoxy groups such as methoxy, epoxy-containing groups such as glycidyloxy, and aryl groups such as phenyl and naphthyl. Inter alia, hydrogen, hydroxyl and methyl are preferred as $R^1$ to $R^3$.

In formula (1), $R^4$ is hydrogen or an optionally substituted $C_1$-$C_{30}$, preferably $C_1$-$C_{10}$ monovalent organic group. Suitable monovalent organic groups include alkyl, phenyl, naphthyl, anthracenyl and norbornyl groups in which at least one hydrogen may be substituted by alkyl, aryl, aldehyde, halogen, nitro, nitrile or hydroxyl.

The resin (A) may be obtained from polycondensation reaction of a naphthol or derivative thereof and an aldehyde compound in a solventless system or in a solvent in the presence of an acid or base catalyst at room temperature or under cooling or heating if desired.

Examples of the naphthol or derivative thereof include 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 5-amino-1-naphthol, 2-methoxycarbonyl-1-naphthol, 1-(4-hydroxyphenyl)naphthalene, 6-(4-hydroxyphenyl)-2-naphthol, 6-(cyclohexyl)-2-naphthol, 1,1'-bi-2-naphthol, 6,6'-bi-2-naphthol, 9,9-bis(6-hydroxy-2-naphthyl)fluorene, 6-hydroxy-2-vinylnaphthalene, 1-hydroxymethylnaphthalene, and 2-hydroxymethylnaphthalene, which may be used alone or in admixture.

Typically the aldehyde compound has the formula (5):

wherein $R^4$ is as defined above.

Examples of the aldehyde compound having formula (5) include formaldehyde, trioxane, paraformaldehyde, acetaldehyde, propylaldehyde, adamantanecarboaldehyde, benzaldehyde, phenylacetaldehyde, α-phenylpropylaldehyde, β-phenylpropylaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthylaldehyde, 2-naphthylaldehyde, anthracenecarboxaldehyde, pyrenecarboxaldehyde, furfural, methylal, phthalaldehyde, isophthalaldehyde, terephthalaldehyde, naphthalenedicarboxaldehyde, anthracenedicarboxaldehyde, and pyrenedicarboxaldehyde, which may be used alone or in admixture.

Examples of the solvent used in the polycondensation reaction include alcohols such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofuran (THF), and 1,4-dioxane; chlorinated solvents such as methylene chloride, chloroform, dichloroethane and trichloroethylene; hydrocarbons such as hexane, heptane, benzene, toluene, xylene and cumene; nitriles such as acetonitrile; ketones such as acetone, ethyl methyl ketone and isobutyl methyl ketone; esters such as ethyl acetate, n-butyl acetate, propylene glycol methyl ether acetate; lactones such as γ-butyrolactone; and aprotic polar solvents such as dimethyl sulfoxide, N,N-dimethylformamide, and hexamethylphosphoric triamide, which may be used alone or in admixture. The solvent may be used in an amount of 0 to 2,000 parts, preferably 10 to 2,000 parts by weight per 100 parts by weight of the naphthol and aldehyde compounds combined.

Examples of the acid catalyst used in the polycondensation reaction include mineral acids such as hydrochloric acid, hydrobromic acid, sulfuric acid, nitric acid, phosphoric acid, and heteropoly-acid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltine dimethoxide, dibutyltin oxide, titanium tetrachloride, titanium tetrabromide, titanium(IV) methoxide, titanium(IV) ethoxide, titanium(IV) isopropoxide, and titanium(IV) oxide.

Examples of the base catalyst used in the polycondensation reaction include inorganic bases such as sodium hydroxide, potassium hydroxide, barium hydroxide, sodium carbonate, sodium hydrogencarbonate, potassium carbonate, lithium hydride, sodium hydride, potassium hydride, and calcium hydride; alkyl metals such as methyl lithium, n-butyl lithium, methylmagnesium chloride, and ethylmagnesium bromide; alkoxides such as sodium methoxide, sodium ethoxide, and potassium t-butoxide; and organic bases such as triethylamine, diisopropylethylamine, N,N-dimethylaniline, pyridine, and 4-dimethylaminopyridine.

The catalyst is preferably used in an amount of 0.001 to 100 parts by weight, more preferably 0.005 to 50 parts by weight per 100 parts by weight of the naphthol and aldehyde compounds combined. The reaction temperature is preferably in a range from −50° C. to about the boiling point of the solvent, more preferably from room temperature to 100° C.

The polycondensation reaction may be carried out, for example, by adding entire amounts of naphthol (or derivative), aldehyde and catalyst at a time, or by adding dropwise naphthol (or derivative) and aldehyde in the presence of catalyst.

Preferably naphthol or derivative and the aldehyde compound are combined in such a ratio that 0.01 to 5 moles, more preferably 0.05 to 2 moles, even more preferably 0.05 to 1 mole, and most preferably 0.1 to 0.9 mole of the aldehyde compound is present per mole of naphthol or derivative in total.

At the end of polycondensation reaction, any unreacted reactants and catalyst are desirably removed from the system. To this end, an appropriate method may be chosen depending on the properties of the reaction product, among a method of heating the reactor at a temperature of 130 to 230° C. to remove volatiles under a pressure of about 1 to 50 mmHg, a method of adding an appropriate solvent or water and fractionating the polymer, and a method of dissolving the polymer in a good solvent and re-precipitating in a poor solvent.

The resin (A) thus obtained should preferably have a weight average molecular weight (Mw) of 500 to 500,000, especially 1,000 to 100,000. The resin should preferably have a dispersity (Mw/Mn) of 1.2 to 20. Once a monomer fraction, oligomer fraction and low-molecular-weight fraction having a Mw of less than 500 are cut off, the amount of volatiles during bake may be reduced, which is effective for preventing contamination around the bake cup and formation of surface defects resulting from volatiles dropping down.

Preferably, the resin composition (A) contains a crosslinker for causing the resin (A) to crosslink via thermal reaction. The crosslinker is preferably selected from epoxy compounds and epoxy resins having at least two functional groups per molecule, and amino resins such as methylol melamine. Further preferably, a catalyst is added to promote crosslinking reaction of the resin with the crosslinker.

Suitable epoxy compounds and epoxy resins include multifunctional epoxy resins having a functionality of 2, 3, 4 or more, for example, commercially available as EOCN-1020 (shown below), EOCN-1025, XD-1000, NC-2000-L, EPPN-201, GAN, and NC6000 from Nippon Kayaku Co., Ltd. and crosslinkers of the following formulae.

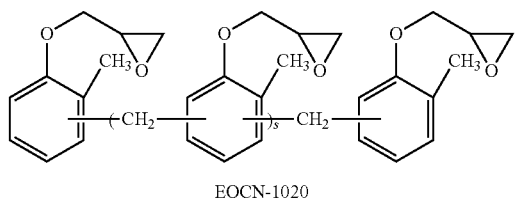

EOCN-1020 s = 3 to 6

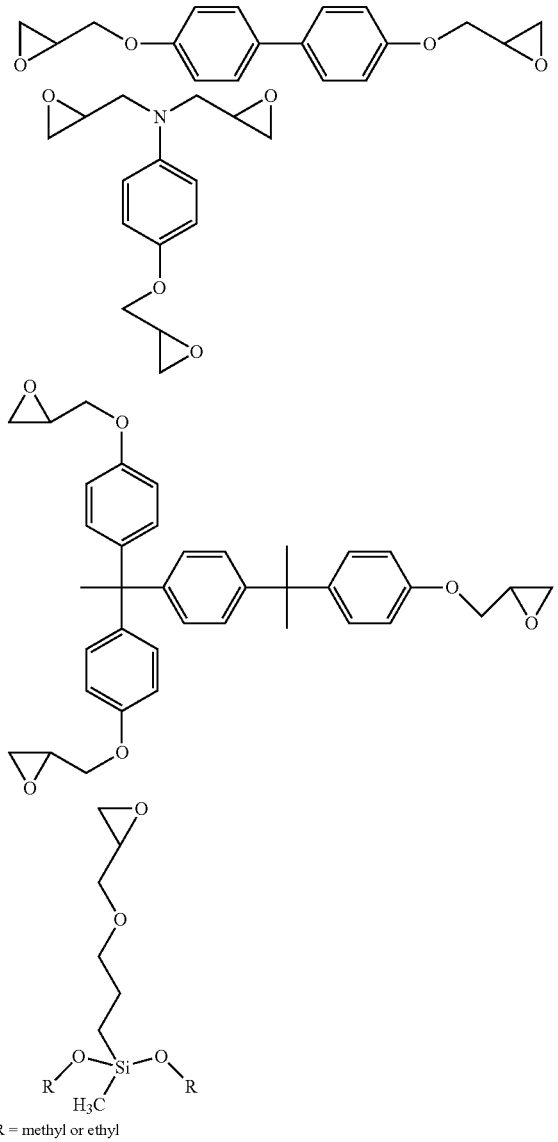

R = methyl or ethyl

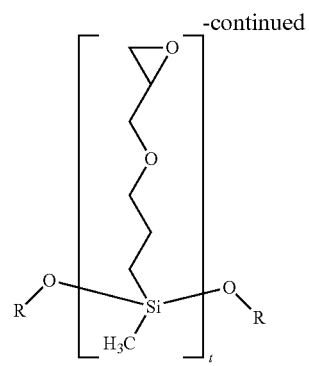

R = methyl or ethyl
t = 1  20 wt %
t = 2  75 wt %
t ≥ 3   5 wt %

The epoxy crosslinker may be added in an amount of 0.1 to 50 parts, preferably 0.1 to 30 parts, and more preferably 1 to 30 parts by weight per 100 parts by weight of the resin comprising repeating units of formula (1). A mixture of two or more crosslinkers may be used. As long as the crosslinker is used in the range, a sufficient crosslinking density is available and the cured product exerts satisfactory effects.

It is noted that when the above-mentioned epoxy resin is used as the crosslinker, a cure accelerator is preferably added as the catalyst. The epoxy resin cure accelerator is effective for adequate and uniform progress of curing reaction.

Examples of the epoxy resin cure accelerator include imidazole compounds such as 2-methylimidazole, 2-ethylimidazole, 2-ethyl-4-methylimidazole, ethylisocyanates of the foregoing, 2-phenylimidazole, 2-phenyl-4-methylimidazole, 2-phenyl-4-methyl-5-hydroxymethylimidazole, and 2-phenyl-4,5-dihydroxymethylimidazole; DBU compounds such as 1,8-diazabicyclo[5.4.0]undecene-7 (DBU), 1,5-diazabicyclo[4.3.0]nonene-5 (DBN), organic acid salts of DBU, phenolic resin salts of DBU, and tetraphenylborate salts of DBU derivatives; triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine-triphenylborate, and tetraphenylphosphine-tetraphenylborate; quaternary phosphonium salts, tertiary amines such as triethyleneammonium-triphenylborate, and tetraphenylboric acid salts thereof. The cure accelerators may be used alone or in admixture.

The amount of the cure accelerator used may be 0.1 to 10 parts, preferably 0.2 to 5 parts by weight per 100 parts by weight of the resin (A).

Suitable amino resins such as methylol melamine include amino condensates modified with formaldehyde or formaldehyde-alcohol, and phenol compounds having on average at least two methylol or alkoxymethylol groups per molecule.

The amino resin should preferably have a Mw of 150 to 10,000, more preferably 200 to 3,000 as measured versus polystyrene standards by GPC. As long as the amino resin has a Mw in the range, sufficient cure takes place and the cured composition has heat resistance.

Suitable amino condensates modified with formaldehyde or formaldehyde-alcohol include melamine condensates modified with formaldehyde or formaldehyde-alcohol and urea condensates modified with formaldehyde or formaldehyde-alcohol.

The melamine condensate modified with formaldehyde or formaldehyde-alcohol may be prepared, for example, by modifying a melamine monomer with formaldehyde into a methylol form in a well-known manner, or by further modifying it with an alcohol into an alkoxy form, i.e., into a modified melamine having the formula shown below. The alcohol used herein is preferably selected from lower alcohols, typically alcohols of 1 to 4 carbon atoms.

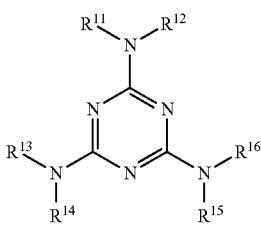

Herein $R^{11}$ to $R^{16}$ are each independently a methylol group, an alkoxymethyl group containing a $C_1$-$C_1$ alkoxy moiety, or hydrogen, at least one of $R^{11}$ to $R^{16}$ being methylol or alkoxymethyl.

Examples of the modified melamine include trimethoxymethylmonomethylolmelamine, dimethoxymethylmonomethylolmelamine, trimethylolmelamine, hexamethylolmelamine, and hexamethoxymethylolmelamine. Subsequently, the modified melamine or an oligomer thereof (e.g., dimer, trimer or oligomer) is subjected to addition polycondensation with formaldehyde by an ordinary technique until the desired molecular weight is reached, obtaining a melamine condensate modified with formaldehyde or formaldehyde-alcohol. At least one modified melamine condensate selected from the modified melamines and condensates thereof may be used as the crosslinker.

The urea condensate modified with formaldehyde or formaldehyde-alcohol may be prepared, for example, by modifying a urea condensate having a desired molecular weight with formaldehyde into a methylol form in a well-known manner, or further modifying it with an alcohol into an alkoxy form.

Examples of the modified urea condensate include methoxymethylated urea condensates, ethoxymethylated urea condensates, and propoxymethylated urea condensates. These modified urea condensates may be used alone or in admixture.

Examples of the phenol compound having on the average at least two methylol or alkoxymethylol groups per molecule include (2-hydroxy-5-methyl)-1,3-benzenedimethanol and 2,2',6,6'-tetramethoxymethylbisphenol A.

These amino condensates or phenol compounds may be used alone or in admixture.

Preferably the amino resin is used in an amount of 0.1 to 50 parts, more preferably 1 to 30 parts by weight per 100 parts by weight of the resin (A). As long as the amount of the amino resin is in the range, the resin composition (A) fully cures and the cured product exerts satisfactory effects.

Where the amino resin such as methylolmelamine is used as the crosslinker, a thermal acid generator is preferably added as the catalyst. The thermal acid generator is preferably an ammonium salt having the following formula, but not limited thereto.

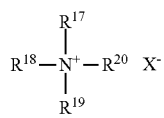

Herein $R^{17}$, $R^{18}$, $R^{19}$ and $R^{20}$ are each independently hydrogen, a $C_1$-$C_{12}$ straight, branched or cyclic alkyl or oxoalkyl group, $C_2$-$C_{12}$ straight, branched or cyclic alkenyl or oxoalkenyl group, $C_6$-$C_{20}$ aryl group, or $C_7$-$C_{12}$ aralkyl or aryloxoalkyl group, in which one or more or even all hydrogen atoms may be substituted by alkoxy moieties. Two of $R^{17}$ to $R^{20}$ may bond with the nitrogen atom to form a ring, and in the case of ring formation, the ring may be a $C_3$-$C_{10}$ aliphatic ring containing the nitrogen atom therein or a $C_5$-$C_{10}$ hetero-aromatic ring containing the nitrogen atom therein. $X^-$ is a sulfonic acid in which at least one α-position is fluorinated, or perfluoroalkylimidic acid or perfluoroalkylmethide acid.

Specifically, $X^-$ is selected from perfluoroalkanesulfonic acid anions such as triflate and nonaflate, sulfonate anions in which at least one α-position is fluorinated, imide anions such as bis(trifluoromethylsulfonyl)imide, bis(perfluoroethylsulfonyl)imide, and bis(perfluorobutylsulfonyl)imide, and methanide anions such as tris(trifluoromethylsulfonyl)methanide and tris(perfluoroethylsulfonyl)methanide.

Preferably the thermal acid generator is used in an amount of 0.1 to 15 parts, more preferably 0.2 to 10 parts by weight per 100 parts by weight of the resin (A). Within the range, the composition (A) has shelf stability and fully cures.

The resin composition (A) may further contain a solvent. Examples of the solvent used herein include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, propylene glycol mono-t-butyl ether acetate, and γ-butyrolactone, which may be used alone or in admixture. The solvent is preferably used in an amount of 100 to 5,000 parts, more preferably 150 to 2,500 parts by weight per 100 parts by weight of the resin (A).

Alternatively, the resin composition (A) may be used as a solvent-free composition in film form.

If desired, the resin composition (A) may contain a surfactant and an antioxidant for improving heat resistance or other properties.

Although the surfactant used herein is not particularly limited, examples include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenol ether and polyoxyethylene nonyl phenol ether; polyoxyethylene polyoxypropylene block copolymers; sorbitan fatty acid esters such as sorbitan monolaurate, sorbitan monopalmitate and sorbitan monostearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP® EF301, EF303 and EF352 (Tohkem Products Co., Ltd.), Megaface® F171, F172, F173 (DIC Corp.), Fluorad® FC430 and FC431 (3M), Asahiguard AG710, Surflon® S-381, S-382, SC101, SC102, SC103, SC104, SC105, SC106, Surfynol® E1004, KH-10, KH-20, KH-30, and KH-40 (Asahi Glass Co., Ltd.); organosiloxane polymers KP341, X-70-092, X-70-093, X-70-1102 (Shin-Etsu Chemical Co., Ltd.), acrylic acid or methacrylic acid Polyflow No. 75, No. 95 (Kyoeisha Ushi Kagaku Kogyo Co., Ltd.). These surfactants may be used alone or in a combination of two or more.

The antioxidant used herein is preferably at least one compound selected from among hindered phenol compounds, hindered amine compounds, organophosphorus compounds, and organosulfur compounds.

Although the hindered phenol compounds used herein are not particularly limited, the hindered phenol compounds listed below are preferred.

1,3,5-trimethyl-2,4,6-tris(3,5-di-t-butyl-4-hydroxybenzyl) benzene (trade name: IRGANOX 1330),
2,6-di-t-butyl-4-methylphenol (trade name: Sumilizer BHT),
2,5-di-t-butylhydroquinone (trade name: Nocrac NS-7),
2,6-di-t-butyl-4-ethylphenol (trade name: Nocrac M-17),
2,5-di-t-pentylhydroquinone (trade name: Nocrac DAH),
2,2'-methylenebis(4-methyl-6-t-butylphenol) (trade name: Nocrac NS-6),
3,5-di-t-butyl-4-hydroxybenzyl phosphonate diethyl ester (trade name: IRGANOX 1222),
4,4'-thiobis(3-methyl-6-t-butylphenol) (trade name: Nocrac 300),
2,2'-methylenebis(4-ethyl-6-t-butylphenol) (trade name: Nocrac NS-5),
4,4'-butylidenebis(3-methyl-6-t-butylphenol) (Adeka Stab AO-40),
2-t-butyl-6-(3-t-butyl-2-hydroxy-5-methylbenzyl)-4-methylphenyl acrylate (trade name: Sumilizer GM),
2-[1-(2-hydroxy-3,5-di-t-pentylphenyl)ethyl]-4,6-di-t-pentylphenyl acrylate (trade name: Sumilizer GS),
2,2'-methylenebis[4-methyl-6-(α-methylcyclohexyl)phenol],
4,4'-methylenebis(2,6-di-t-butylphenol) (trade name: Seenox 226M),
4,6-bis(octylthiomethyl)-o-cresol (trade name: IRGANOX 1520L),
2,2'-ethylenebis(4,6-di-t-butylphenol),
octadecyl 3-(3,5-di-t-butyl-4-hydroxyphenyl)propionate (trade name: IRGANOX 1076),
1,1,3-tris(2-methyl-4-hydroxy-5-t-butylphenyl)butane (trade name: Adeka Stab AO-30),
tetrakis[methylene-(3,5-di-t-butyl-4-hydroxyhydrocinnamate)]methane (trade name: Adeka Stab AO-60),
triethylene glycol bis[3-(3-t-butyl-5-methyl-4-hydroxyphenyl)propionate] (trade name: IRGANOX 245),
2,4-bis(n-octylthio)-6-(4-hydroxy-3,5-di-t-butylanilino)-1,3,5-triazine (trade name: IRGANOX 565),
N,N'-hexamethylenebis(3,5-di-t-butyl-4-hydroxyhydrocinnamide) (trade name: IRGANOX 1098),
1,6-hexanediol-bis[3-(3,5-di-t-butyl-4-hydroxyphenyl)propionate] (trade name: IRGANOX 259),
2,2-thio-diethylenebis[3-(3,5-di-t-butyl-4-hydroxyphenyl) propionate] (trade name: IRGANOX 1035),
3,9-bis[2-[3-(3-t-butyl-4-hydroxy-5-methylphenyl)propionyloxy]-1,1-dimethylethyl]
2,4,8,10-tetraoxaspiro[5.5]undecane (trade name: Sumilizer GA-80), tris(3,5-di-t-butyl-4-hydroxybenzyl) isocyanurate (trade name: IRGANOX 3114),
bis(ethyl 3,5-di-t-butyl-4-hydroxybenzylphosphonate) calcium/polyethylene wax 50/50 mixture (trade name: IRGANOX 1425WL),
isooctyl 3-(3,5-di-t-butyl-4-hydroxyphenyl)propionate (trade name: IRGANOX 1135),
4,4'-thiobis(6-t-butyl-3-methylphenol) (trade name: Sumilizer WX-R),
6-p-(3-t-butyl-4-hydroxy-5-methylphenyl)propoxyl-2,4,8,10-tetra-t-butyldibenzo-[d,f][1,3,2]dioxaphosphepin (trade name: Sumilizer GP), etc.

Although the hindered amine compounds used herein are not particularly limited, the hindered amine compounds listed below are preferred.

p,p'-dioctyldiphenylamine (trade name: IRGANOX 5057),
phenyl-α-naphthylamine (trade name: Nocrac PA),
poly(2,2,4-trimethyl-1,2-dihydroquinoline) (trade name: Nocrac 224, 224-S),
6-ethoxy-2,2,4-trimethyl-1,2-dihydroquinoline (trade name: Nocrac AW),
N,N'-diphenyl-p-phenylenediamine (trade name: Nocrac DP),
N,N'-di-β-naphthyl-p-phenylenediamine (trade name: Nocrac White),
N-phenyl-N'-isopropyl-p-phenylenediamine (trade name: Nocrac 810NA),
N,N'-diallyl-p-phenylenediamine (trade name: Nonflex TP),
4,4'-(α,α-dimethylbenzyl)diphenylamine (trade name: Nocrac CD),
p,p-toluenesulfonylaminodiphenylamine (trade name: Nocrac TD),
N-phenyl-N'-(3-methacryloxy-2-hydroxypropyl)-p-phenylenediamine (trade name: Nocrac G1),
N-(1-methylheptyl)-N'-phenyl-p-phenylenediamine (trade name: Ozonon 35),
N,N'-di-sec-butyl-p-phenylenediamine (trade name: Sumilizer BPA),
N-phenyl-N'-1,3-dimethylbutyl-p-phenylenediamine (trade name: Antigene 6C),
alkylated diphenylamine (trade name: Sumilizer 9A),
dimethyl-1-(2-hydroxyethyl)-4-hydroxy-2,2,6,6-tetramethylpiperidine succinate polycondensate (trade name: Tinuvin 622LD),
poly[[6-(1,1,3,3-tetramethylbutyl)amino]-1,3,5-triazine-2,4-diyl][(2,2,6,6-tetramethyl-4-piperidyl)imino]hexamethylene[(2,2,6,6-tetramethyl-4-piperidyl)imino]] (trade name: CHIMASSORB 944),
N,N'-bis(3-aminopropyl)ethylenediamine-2,4-bis[N-butyl-N-(1,2,2,6,6-pentamethyl-4-piperidyl)amino]-6-chloro-1,3,5-triazine condensate (trade name: CHIMASSORB 119FL),
bis(1-octyloxy-2,2,6,6-tetramethyl-4-piperidyl)sebacate (trade name: Tinuvin 123),
bis(2,2,6,6-tetramethyl-4-piperidyl)sebacate (trade name: Tinuvin 770),
bis(1,2,2,6,6-pentamethyl-4-piperidyl) 2-(3,5-di-t-butyl-4-hydroxybenzyl)-2-n-butylmalonate (trade name: Tinuvin 144),
bis(1,2,2,6,6-pentamethyl-4-piperidyl)sebacate (trade name: Tinuvin 765),
tetrakis(1,2,2,6,6-pentamethyl-4-piperidyl) 1,2,3,4-butanetetracarboxylate (trade name: LA-57),
tetrakis(2,2,6,6-tetramethyl-4-piperidyl) 1,2,3,4-butanetetracarboxylate (trade name: LA-52),
an esterified mixture of 1,2,3,4-butanetetracarboxylic acid with 1,2,2,6,6-pentamethyl-4-piperidinol and 1-tridecanol (trade name: LA-62),
an esterified mixture of 1,2,3,4-butanetetracarboxylic acid with 2,2,6,6-tetramethyl-4-piperidinol and 1-tridecanol (trade name: LA-67),
an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P),
an esterified mixture of 1,2,3,4-butanetetracarboxylic acid with 2,2,6,6-tetramethyl-4-piperidinol and 3,9-bis(2-hydroxy-1,1-dimethylethyl)-2,4,8,10-tetraoxaspiro[5.5]undecane (trade name: LA-68LD),
(2,2,6,6-tetramethylene-4-piperidyl)-2-propylene carboxylate (trade name: Adeka Stab LA-82),
(1,2,2,6,6-pentamethyl-4-piperidyl)-2-propylene carboxylate (trade name: Adeka Stab LA-87), etc.

Although the organophosphorus compounds used herein are not particularly limited, the organophosphorus compounds listed below are preferred.

bis(2,4-di-t-butylphenyl)[1,1-biphenyl]-4,4'-diyl bisphosphite,
9,10-dihydro-9-oxa-10-phosphaphenanthrene-10-oxide (trade name: Sanko HCA),
triethyl phosphite (trade name: JP302),
tri-n-butyl phosphite (trade name: JP304),
triphenyl phosphite (trade name: Adeka Stab TPP),
diphenyl monooctyl phosphite (trade name: Adeka Stab C),
tri(p-cresyl) phosphite (trade name: Chelex-PC),
diphenyl monodecyl phosphite (trade name: Adeka Stab 135A),
diphenyl mono(tridecyl) phosphite (trade name: JPM313),
tris(2-ethylhexyl) phosphite (trade name: JP308),
phenyl didecyl phosphite (trade name: Adeka Stab 517),
tridecyl phosphite (trade name: Adeka Stab 3010),
tetraphenyl dipropylene glycol diphosphite (trade name: JPP100),
bis(2,4-di-t-butylphenyl) pentaerythritol diphosphite (trade name: Adeka Stab PEP-24G),
tris(tridecyl) phosphite (trade name: JP333E),
bis(nonylphenyl) pentaerythritol diphosphite (trade name: Adeka Stab PEP-4C),
bis(2,6-di-t-butyl-4-methylphenyl) pentaerythritol diphosphite (trade name: Adeka Stab PEP-36),
bis[2,4-di(1-phenylisopropyl)phenyl] pentaerythritol diphosphite (trade name: Adeka Stab PEP-45),
trilauryl trithiophosphite (trade name: JPS312),
tris(2,4-di-t-butylphenyl) phosphite (trade name: IRGAFOS 168),
tris(nonylphenyl) phosphite (trade name: Adeka Stab 1178),
distearyl pentaerythritol diphosphite (trade name: Adeka Stab PEP-8),
tris(mono, dinonylphenyl) phosphite (trade name: Adeka Stab 329K),
trioleyl phosphite (trade name: Chelex-OL),
tristearyl phosphite (trade name: JP318E),
4,4'-butylidene bis(3-methyl-6-t-butylphenylditridecyl) phosphite (trade name: JPH1200),
tetra(mixed $C_{12}$-$C_{15}$ alkyl)-4,4'-isopropylidene diphenyl diphosphite (trade name: Adeka Stab 1500),
tetra(tridecyl)-4,4'-butylidene bis(3-methyl-6-t-butylphenyl) diphosphite (trade name: Adeka Stab 260),
hexa(tridecyl)-1,1,3-tris(2-methyl-5-t-butyl-4-hydroxyphenyl)butane triphosphite (trade name: Adeka Stab 522A),
hydrogenated bisphenol A phosphite polymer (HBP), tetrakis(2,4-di-t-butylphenyloxy)-4,4'-biphenylene diphosphine (trade name: P-EPQ),
tetrakis(2,4-di-t-butyl-5-methylphenyloxy) 4,4'-biphenylene diphosphine (trade name: GSY-101P),
2-[[2,4,8,10-tetrakis(1,1-dimethylethyl)dibenzo[d,f][1,3,2]dioxaphosphepin-6-yl]oxy]-N,N-bis[2-[[2,4,8,10-tetrakis(1,1-dimethylethyl)dibenzo[d,f][1,3,2]dioxaphosphepin-6-yl]oxy]-ethyl]ethanamine (trade name: IRGAFOS 12),
2,2'-methylenebis(4,6-di-t-butylphenyl)octyl phosphite (trade name: Adeka Stab HP-10), etc.

Although the organosulfur compounds used herein are not particularly limited, the organosulfur compounds listed below are preferred.
dilauryl 3,3'-thiodipropionate (trade name: Sumilizer TPL-R),
dimyristyl 3,3'-thiodipropionate (trade name: Sumilizer TPM),
distearyl 3,3'-thiodipropionate (trade name: Sumilizer TPS),
pentaerythritol tetrakis(3-laurylthiopropionate) (trade name: Sumilizer TP-D),
ditridecyl 3,3'-thiodipropionate (trade name: Sumilizer TL),
2-mercaptobenzimidazole (trade name: Sumilizer MB),
ditridecyl 3,3'-thiodipropionate (trade name: Adeka Stab AO-503A),
1,3,5-tris-β-stearylthiopropionyloxyethyl isocyanurate,
didodecyl 3,3'-thiodipropionate (trade name: IRGANOX PS 800FL),
dioctadecyl 3,3'-thiodipropionate (trade name: IRGANOX PS 802FL), etc.

Of the foregoing antioxidants, Adeka Stab AO-60 is most preferred. An appropriate amount of the antioxidant added is 0.5 to 5 parts by weight, more preferably 1 to 3 parts by weight per 100 parts by weight of the resin (A). Within the range, heat resistance and compatibility are available. Notably the antioxidant is not limited to one type and a mixture of two or more types may be used.

To the resin composition (A), any well-known filler such as silica may be added in an amount of up to 50 parts by weight per 100 parts by weight of the resin (A) for further enhancing heat resistance.

The resin composition (A) in the form of a solution is applied onto a support by any suitable techniques such as spin coating, roll coating, die coating, printing, and dipping. Thereafter, the coating may be prebaked at a temperature (selected depending on the volatility of solvent), preferably of 80 to 200° C., more preferably 100 to 180° C. to volatilize off the solvent, yielding a resin composition layer (A').

In the alternative embodiment wherein the resin composition (A) is of film form, the film-form composition is applied onto a support by a laminating technique, yielding a resin composition layer (A').

Once the resin composition layer (A') is formed on a support by either of the above procedures, it is heat cured into a resin layer (A). This cure may be achieved by heating on a hot plate or oven, typically at a temperature of 100 to 350° C. for 5 to 10 minutes, preferably 150 to 300° C. for 3 to 8 minutes. The curing reaction may also be achieved, after a green laminate including uncured resin composition layer (A') is constructed, by heating the overall laminate.

The resin layer (A) formed on the support preferably has a thickness of 0.1 to 50 μm, more preferably 0.3 to 30 μm. As long as the thickness is in the range, the layer is sufficiently light shielding and fully flat.

The resin layer (A) functions as a light-shielding layer, as demonstrated by a transmittance of preferably up to 20%, more preferably up to 18%, and even more preferably up to 15% with respect to light of wavelength 500 nm. Further preferably, the resin layer (A) has an absorption peak wavelength of up to 500 nm and is capable of shielding more than 80% of light in a wavelength range of up to 500 nm.

Resin Layer (B)

The resin layer (B) is constructed by a cured product of a resin composition (B) comprising a resin (B) containing a siloxane skeleton and an epoxy group, as viewed from heat resistance. For the purpose of bonding heterogeneous substrates, i.e., a support and a silicon wafer, and from the standpoint of warpage suppression, the cured product should have a resin modulus of 10 to 1,000 MPa at 25° C. As used herein, the "resin modulus" refers to a storage elastic modulus (E') at a certain temperature which is measured on a specimen in the form of cured resin composition (B) of 30 mm×10 mm×0.5 mm thick under tensile conditions at frequency 1 Hz, using a standard dynamic viscoelasticity meter.

Typical of the resin (B) is an epoxy-modified silicone resin. The epoxy-modified silicone resin is preferably a resin comprising repeating units of the formula (2) and optionally repeating units of the formula (3).

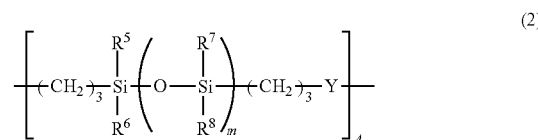

(2)

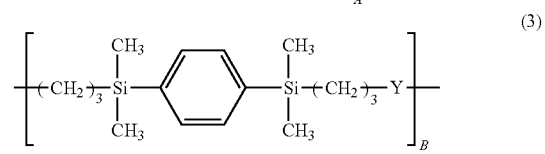

(3)

Herein $R^5$ to $R^8$ are each independently a $C_1$-$C_8$ monovalent hydrocarbon group, m is an integer of 1 to 100, A and B are (positive) numbers in the range: 0<A≤1, 0≤B≤1, and A+B=1. Y is a divalent organic group having the formula (4):

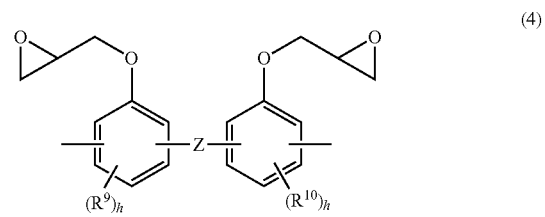

(4)

wherein Z is a single bond or a divalent organic group selected from the following:

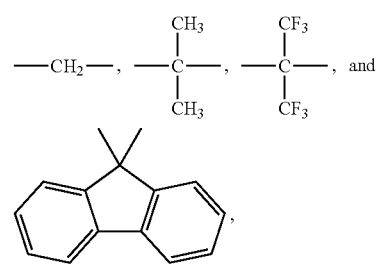

$R^9$ and $R^{10}$ each are a $C_1$-$C_4$ alkyl or alkoxy group, and h is 0, 1 or 2.

The epoxy-modified silicone resin should preferably have a Mw of 3,000 to 500,000, more preferably 10,000 to 100,000. The siloxane content in resin layer (B) is desirably controlled to a range of 30 to 80% by weight based on the base polymer.

The epoxy-modified silicone resin may be synthesized, for example, by the method of JP-A 2013-110391.

The resin composition (B) preferably contains a crosslinker so that the composition is heat curable, the crosslinker being at least one member selected from phenol compounds having on average at least two phenolic hydroxyl groups per molecule and epoxy compounds having on average at least two epoxy groups per molecule.

The epoxy compounds are not particularly limited, and suitable examples thereof are as exemplified above for the resin layer (A).

The phenol compounds are not particularly limited, and suitable examples thereof include m- or p-cresol base novolak resins (e.g., EP-6030G from Asahi Organic Chemical Industry Co., Ltd.), trifunctional phenol compounds (e.g., TrisP-PA from Honshu Chemical Industry Co., Ltd.), and tetrafunctional phenol compounds (e.g., TEP-TPA from Asahi Organic Chemical Industry Co., Ltd.).

The crosslinker is preferably added in an amount of 0.1 to 50 parts, more preferably 0.1 to 30 parts, and even more preferably 1 to 20 parts by weight per 100 parts by weight of the resin (B). The crosslinkers may be used alone or in admixture.

Further, the resin composition (B) may contain up to 10 parts by weight of a curing catalyst such as acid anhydride per 100 parts by weight of the epoxy-modified silicone resin.

The resin composition (B) may contain a solvent. Examples of the solvent used herein include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, propylene glycol mono-t-butyl ether acetate, and γ-butyrolactone, which may be used alone or in admixture. An appropriate amount of the solvent added is 40 to 1,000 parts, more preferably 50 to 600 parts by weight per 100 parts by weight of the resin (B).

Alternatively, the resin composition (B) may be used as a solvent-free composition in film form.

If desired, the resin composition (B) may contain a surfactant and an antioxidant for improving coating uniformity and heat resistance. Suitable surfactants and antioxidants are as exemplified above for the resin layer (A).

To the resin composition (B), a filler such as silica may be added in an amount of up to 50 parts by weight per 100 parts by weight of the resin (B) for further enhancing heat resistance.

The resin composition (B) in solution form may be applied onto the resin layer (A), resin composition layer (A') or resin layer (C) by any suitable techniques such as spin coating, roll coating, die coating, printing and dipping. Thereafter, the coating is prebaked at a temperature (selected depending on the volatility of solvent), for example, preferably at 60 to 160° C. for 1 to 4 minutes, more preferably at 80 to 140° C. for 2 to 4 minutes to volatilize off the solvent, yielding a resin composition layer (B').

In the alternative embodiment wherein the resin composition (B) is of film form, the film-form composition is applied onto the resin layer (A), resin composition layer (A') or resin layer (C) by a laminating technique, yielding a resin composition layer (B').

The resin composition layer (B') is heat cured to form a resin layer (B). The resin layer (B) as cured preferably has a thickness of 1 to 200 μm, more preferably 5 to 150 μm, depending on steps on the wafer side. As long as the thickness is in the range, the layer is sufficiently adhesive upon bonding and fully flat after bonded to the wafer.

Resin Layer (C)

The resin layer (C) is composed of a siloxane skeleton-free thermoplastic resin (non-silicone thermoplastic resin). From the standpoint of applicability to a stepped silicon wafer, a non-silicone thermoplastic resin having a satisfactory spin-coating ability is preferably used to form the thermoplastic resin layer (C). The preferred non-silicone thermoplastic resins are those resins having a glass transition temperature (Tg) of about −80° C. to about 120° C. and a Mw of 20,000 to 200,000, more preferably 30,000 to 150,000.

Suitable non-silicone thermoplastic resins include olefin base thermoplastic elastomers, butadiene base thermoplastic elastomers, styrene base thermoplastic elastomers, styrene-butadiene base thermoplastic elastomers, and styrene-olefin base thermoplastic elastomers. Inter alia, hydrogenated styrene base elastomers are preferred because of heat resistance. Such thermoplastic resins are commercially available as Tuftec® (Asahi Kasei Chemicals Corporation), ESPOLEX® SB Series (Sumitomo Chemical Co., Ltd.), RABALON® (Mitsubishi Chemical Corp.), SEPTON® (Kuraray Co., Ltd.), and DYNARON® (JSR Corporation). Also preferred are cycloolefin polymers as typified by ZEONEX® (ZEON Corp.) and cyclic olefin copolymers as typified by TOPAS® (Polyplastics Co., Ltd.).

The non-silicone thermoplastic resin is preferably a non-silicone thermoplastic elastomer. The composite temporary adhesive layer including a layer of the non-silicone thermoplastic elastomer allows for easy separation of the wafer from the support after thinning of the wafer, suggesting ease of handling of a fragile thin wafer.

The resin layer (C) is preferably a cured product of a resin composition (C) comprising the non-silicone thermoplastic resin.

The resin composition (C) may further contain an antioxidant for improving heat resistance, a surfactant for facilitating coating, and a parting agent for improving release. A typical antioxidant is di-t-butylphenol. Suitable surfactants include fluorosilicone surfactants, for example, X-70-1102 (Shin-Etsu Chemical Co., Ltd.). A typical parting agent is KF-96 (Shin-Etsu Chemical Co., Ltd.).

The resin composition (C) may further contain a solvent. Suitable solvents include hydrocarbon solvents such as nonane, p-menthane, pinene, isooctane, toluene, xylene and mesitylene. Inter alia, nonane, p-menthane, isooctane and mesitylene are preferred for efficient coating. The solvents may be used alone or in admixture. An appropriate amount of the solvent is 250 to 3,500 parts, more preferably 300 to 2,000 parts by weight per 100 parts by weight of the resin (C).

Alternatively, the resin composition (C) may be used as a solvent-free composition in film form.

The resin composition (C) in the form of a solution is applied onto a wafer by any suitable techniques such as spin coating, roll coating, die coating, printing, and dipping. Thereafter, the coating may be heated on a hot plate or in an oven to form a resin layer (C). Suitable heating conditions include a temperature of 100 to 200° C. for 1 to 10 minutes, more preferably 130 to 190° C. for 2 to 5 minutes, because the risk of residual solvent due to under-heating is eliminated.

In the alternative embodiment wherein the resin composition (C) is of film form, the film-form composition is applied onto a wafer by a laminating technique, yielding a resin layer (C).

The resin layer (C) preferably has a thickness of 1 to 20 µm, more preferably 2 to 15 µm. A layer thickness in the range ensures uniform coverage of a stepped wafer.

Preparation of Wafer Laminate

The method for preparing the wafer laminate according to the invention uses a support, a wafer having a circuit-forming surface, and an adhesive layer consisting of resin layers (A), (B) and (C). The method involves the steps (a) to (e), which are described below.

Step (a):

Step (a) is to form the resin layer (A) having light-shielding properties or the resin composition layer (A') on the support. In the embodiment wherein the resin composition (A) capable of forming resin layer (A) is a solution, it is applied onto the support by a suitable technique such as spin coating or roll coating. The coating is prebaked at a temperature of 80 to 200° C., preferably 100 to 180° C., depending on the volatility of the solvent, to volatilize off the solvent, for thereby forming the resin composition layer (A'). In the alternative embodiment wherein the resin composition (A) is of film form, it is laminated onto the support to form the resin composition layer (A').

Once the resin composition layer (A') is formed on the support, it is heat cured into resin layer (A). This cure may be achieved by heating on a hot plate or oven, typically at a temperature of 100 to 350° C., preferably 150 to 300° C. The curing time is typically 1 to 10 minutes, preferably 2 to 8 minutes. The curing reaction may also be achieved, after a green wafer laminate is constructed using resin composition layer (A') in the uncured state, by heating the overall laminate.

Step (b):

Step (b) is to form the resin layer (C) on the circuit-forming surface of the wafer. In the embodiment wherein the resin composition (C) is a solution, it is applied onto the wafer by a suitable technique such as spin coating, roll coating, die coating, printing or dipping. The coating is then heated on a hot plate or in an oven to form the non-silicone thermoplastic resin layer (C). In the alternative embodiment wherein the resin composition (C) is of film form, it is laminated onto the wafer to form the non-silicone thermoplastic resin layer (C).

Step (c) or (c'):

Step (c) is to form the resin composition layer (B') capable of forming the resin layer (B) on the resin layer (A) or resin composition layer (A'). Step (c') is to form the resin composition layer (B') capable of forming the resin layer (B) on the resin layer (C). In the embodiment wherein the resin composition (B) is a solution, it is applied onto the resin layer (A) or resin composition layer (A') or resin layer (C) by a suitable technique such as spin coating, roll coating, die coating, printing or dipping. The coating is prebaked at a temperature of 60 to 160° C. for 1 to 4 minutes, preferably at 80 to 140° C. for 2 to 4 minutes, depending on the volatility of the solvent, to volatilize off the solvent, for thereby forming the resin composition layer (B'). In the alternative embodiment wherein the resin composition (B) is of film form, it is laminated onto the resin layer (A) or resin composition layer (A') or resin layer (C) to form the resin composition layer (B').

Step (d) or (d'):

Step (d) is to bond the resin composition layer (B') and the resin layer (C) under a reduced pressure. Step (d') is to bond the resin layer (A) or resin composition layer (A') and the resin composition layer (B') under a reduced pressure. The reduced pressure is preferably in a range of 1 to 100 Pa, more preferably 3 to 80 Pa. The assembly is uniformly compressed preferably at a temperature of 40 to 200° C., more preferably 60 to 180° C. in vacuum or reduced pressure, yielding a wafer laminate of wafer bonded to support.

Step (e):

Step (e) is to heat cure the resin composition layer (B') in the wafer laminate resulting from step (d) or (d') to form the resin layer (B) and to bond it to the resin layer (A), or when the resin composition layer (A') is used, to simultaneously heat cure the resin composition layer (A') and the resin composition layer (B') to form the resin layers (A) and (B) and bond them together. Once the green wafer laminate is constructed, it is heated at 120 to 220° C. for 10 minutes to 4 hours, preferably at 150 to 200° C. for 30 minutes to 2 hours, thereby accomplishing heat curing.

In this way, there is obtained the wafer laminate consisting of the support, the adhesive layer, and the substrate having a circuit-forming surface.

Production of Thin Wafer

A thin wafer may be produced by grinding or polishing a non-circuit-forming surface of the wafer of the wafer laminate obtained by the above method.

The next step is to process the non-circuit-forming surface of the wafer laminate which has been ground, i.e., the non-circuit-forming surface of the wafer which has been thinned by back surface grinding. This step includes various processes which can be applied on the wafer level, for example, electrode formation, metal conductor formation, and protective film formation. More specifically, any conventional well-known processes may be applied, including metal sputtering for forming electrodes or the like, wet etching of a sputtered metal layer, formation of a pattern (serving as a mask for metal conductor formation) by resist coating, exposure and development, removal of resist, dry etching, metallization, silicon etching for TSV formation, and oxide film formation on silicon surface.

The thin wafer may be released from the wafer laminate by applying a laser beam of 355 nm.

EXAMPLE

Examples of the invention are given below by way of illustration and not by way of limitation. All parts are by weight. Mw and Mn are measured versus polystyrene standards by GPC using THF solvent. Compounds (M-1) to (M-3) and acid generator AG used in Examples are identified below.

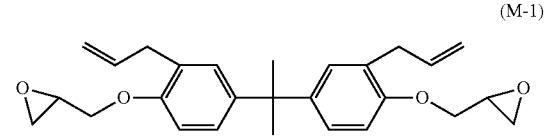

(M-1)

-continued

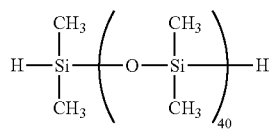
(M-2)

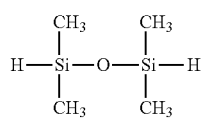
(M-3)

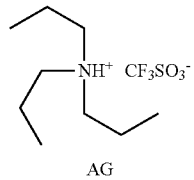
AG

1) Preparation of Resin Composition

Preparation Example 1

In a 5-L flask equipped with a stirrer, thermometer, nitrogen purge line and reflux condenser, 84.1 g of Epoxy Compound (M-1) was dissolved in 250 g of toluene. Then 121.0 g of Compound (M-2) and 21.5 g of Compound (M-3) were added to the solution, which was heated at 60° C. Then 1 g of platinum catalyst on carbon (5 wt %) was added. After it was confirmed that the internal temperature rose to 65-67° C., the reaction solution was heated at 90° C., aged at the temperature for 3 hours, and cooled to room temperature. To the reaction solution was added 250 g of methyl isobutyl ketone (MIBK). The solution was passed through a filter under pressure to remove the platinum catalyst. Once the solvent was distilled off in vacuum from the solution, 150 g of propylene glycol monomethyl ether acetate (PGMEA) was added to the residue to form a resin solution in PGMEA having a solid concentration of 60 wt %. The resin in the solution had a Mw of 45,000.

To 100 g of the resin solution were added 9 g of tetrafunctional phenol compound (TEP-TPA by Asahi Organic Chemical Industry Co., Ltd.) and 0.2 g of tetrahydrophthalic anhydride (Rikacid HH-A by New Japan Chemical Co., Ltd.). Filtration through a membrane filter with a pore size of 1 μm yielded an epoxy-modified silicone resin composition (B1).

Preparation Example 2

In a 5-L flask equipped with a stirrer, thermometer, nitrogen purge line and reflux condenser, 84.1 g of Epoxy Compound (M-1) was dissolved in 170 g of toluene. Then 60.5 g of Compound (M-2) and 24.2 g of Compound (M-3) were added to the solution, which was heated at 60° C. Then 1 g of platinum catalyst on carbon (5 wt %) was added. After it was confirmed that the internal temperature rose to 65-67° C., the reaction solution was heated at 90° C., aged at the temperature for 3 hours, and cooled to room temperature. To the reaction solution was added 170 g of MIBK. The solution was passed through a filter under pressure to remove the platinum catalyst. Once the solvent was distilled off in vacuum from the solution, 110 g of PGMEA was added to the residue to form a resin solution in PGMEA having a solid concentration of 60 wt %. The resin in the solution had a Mw of 42,000.

To 100 g of the resin solution were added 9 g of tetrafunctional phenol compound (TEP-TPA by Asahi Organic Chemical Industry Co., Ltd.) and 0.2 g of tetrahydrophthalic anhydride (Rikacid HH-A by New Japan Chemical Co., Ltd.). Filtration through a membrane filter with a pore size of 1 μm yielded an epoxy-modified silicone resin composition (B2).

Comparative Preparation Example 1

In a 5-L flask equipped with a stirrer, thermometer, nitrogen purge line and reflux condenser, 84.1 g of Epoxy Compound (M-1) was dissolved in 110 g of toluene. Then 26.9 g of Compound (M-3) was added to the solution, which was heated at 60° C. Then 1 g of platinum catalyst on carbon (5 wt %) was added. After it was confirmed that the internal temperature rose to 65-67° C., the reaction solution was heated at 90° C., aged at the temperature for 3 hours, and cooled to room temperature. To the reaction solution was added 110 g of MIBK. The solution was passed through a filter under pressure to remove the platinum catalyst. Once the solvent was distilled off in vacuum from the solution, 70 g of PGMEA was added to the residue to form a resin solution in PGMEA having a solid concentration of 60 wt %. The resin in the solution had a Mw of 25,000.

To 100 g of the resin solution were added 9 g of tetrafunctional phenol compound (TEP-TPA by Asahi Organic Chemical Industry Co., Ltd.) and 0.2 g of tetrahydrophthalic anhydride (Rikacid HH-A by New Japan Chemical Co., Ltd.). Filtration through a membrane filter with a pore size of 1 μm yielded a siloxane-containing composition (B3).

Preparation Example 3

A 1,000-mL flask was charged with 80 g (0.50 mol) of 1,5-dihydroxynaphthalene, 51.6 g (0.30 mol) of 2-hydroxy-6-naphthaldehyde, and 145 g of methyl cellosolve. With stirring at 70° C., 20 g of 20 wt % p-toluenesulfonic acid methyl cellosolve solution was added. The solution was heated at 85° C., stirred at the temperature for 6 hours, cooled to room temperature, and diluted with 800 mL of ethyl acetate. The solution was transferred to a separatory funnel and repeatedly washed with 200 mL of deionized water to remove the reaction catalyst and metal impurities. The solution was concentrated under reduced pressure, 600 mL of ethyl acetate was added to the residue, which was poured into 2,400 mL of hexane, allowing a polymer to precipitate. The polymer precipitate was collected by filtration and dried under reduced pressure, yielding a resin (A1) comprising repeating units of the formula shown below. The resin (A1) had a Mw of 3,200 and a Mw/Mn of 2.44.

A resin composition (A1) was prepared by dissolving 20 parts of resin (A1), 1 part of acid generator AG, and 4 parts of Nicalac MW390 (Sanwa Chemical Co., Ltd.) as crosslinker in 100 parts of PGMEA containing 0.1 wt % of surfactant FC-430 (3M) and passing through a fluororesin filter with a pore size of 0.1 μm.

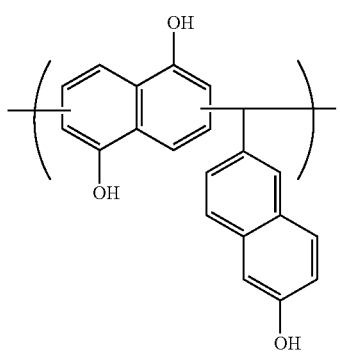

Preparation Example 4

A 1,000-mL flask was charged with 80 g (0.50 mol) of 1,5-dihydroxynaphthalene, 9.0 g (0.30 mol) of paraformaldehyde, and 145 g of methyl cellosolve. With stirring at 70° C., 20 g of 20 wt % p-toluenesulfonic acid methyl cellosolve solution was added. The solution was heated at 85° C., stirred at the temperature for 6 hours, cooled to room temperature, and diluted with 800 mL of ethyl acetate. The solution was transferred to a separatory funnel and repeatedly washed with 200 mL of deionized water to remove the reaction catalyst and metal impurities. The solution was concentrated under reduced pressure, and 600 mL of ethyl acetate was added to the residue, which was poured into 2,400 mL of hexane, allowing a polymer to precipitate. The polymer precipitate was collected by filtration and dried under reduced pressure, yielding a resin (A2) comprising repeating units of the formula shown below. The resin (A2) had a Mw of 1,500 and a Mw/Mn of 2.20.

A resin composition (A2) was prepared by dissolving 20 parts of resin (A2), 1 part of acid generator AG, and 4 parts of Nicalac MW390 (Sanwa Chemical Co., Ltd.) as cross-linker in 100 parts of PGMEA containing 0.1 wt % of surfactant FC-430 (3M) and passing through a fluororesin filter with a pore size of 0.1 μm.

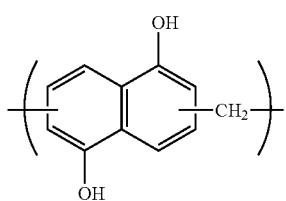

Preparation Example 5

A 1,000-mL flask was charged with 72 g (0.50 mol) of 1-hydroxynaphthalene, 51.6 g (0.30 mol) of 2-hydroxy-6-naphthaldehyde, and 145 g of methyl cellosolve. With stirring at 70° C., 20 g of 20 wt % p-toluenesulfonic acid methyl cellosolve solution was added. The solution was heated at 85° C., stirred at the temperature for 6 hours, cooled to room temperature, and diluted with 800 mL of ethyl acetate. The solution was transferred to a separatory funnel and repeatedly washed with 200 mL of deionized water to remove the reaction catalyst and metal impurities. The solution was concentrated under reduced pressure, and 600 mL of ethyl acetate was added to the residue, which was poured into 2,400 mL of hexane, allowing a polymer to precipitate. The polymer precipitate was collected by filtration and dried under reduced pressure, yielding a resin (A3) comprising repeating units of the formula shown below. The resin (A3) had a Mw of 2,700 and a Mw/Mn of 2.61.

A resin composition (A3) was prepared by dissolving 20 parts of resin (A2), 1 part of acid generator AG, and 4 parts of Nicalac MW390 (Sanwa Chemical Co., Ltd.) as cross-linker in 100 parts of PGMEA containing 0.1 wt % of surfactant FC-430 (3M) and passing through a fluororesin filter with a pore size of 0.1 μm.

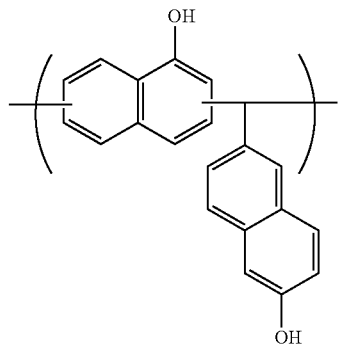

Comparative Preparation Example 2

A 1,000-mL flask was charged with 32.4 g (0.30 mol) of 2-methylhydroxybenzene, 51.6 g (0.30 mol) of 2-hydroxy-6-naphthaldehyde, and 145 g of methyl cellosolve. With stirring at 70° C., 20 g of 20 wt % p-toluenesulfonic acid methyl cellosolve solution was added. The solution was heated at 85° C., stirred at the temperature for 6 hours, cooled to room temperature, and diluted with 800 mL of ethyl acetate. The solution was transferred to a separatory funnel and repeatedly washed with 200 mL of deionized water to remove the reaction catalyst and metal impurities. The solution was concentrated under reduced pressure, and 600 mL of ethyl acetate was added to the residue, which was poured into 2,400 mL of hexane, allowing a polymer to precipitate. The polymer precipitate was collected by filtration and dried under reduced pressure, yielding a resin (A4) comprising repeating units of the formula shown below. The resin (A4) had a Mw of 2,100 and a Mw/Mn of 1.58.

A resin composition (A4) was prepared by dissolving 20 parts of resin (A4), 1 part of acid generator AG, and 4 parts of Nicalac MW390 (Sanwa Chemical Co., Ltd.) as cross-linker in 100 parts of PGMEA containing 0.1 wt % of surfactant FC-430 (3M) and passing through a fluororesin filter with a pore size of 0.1 μm.

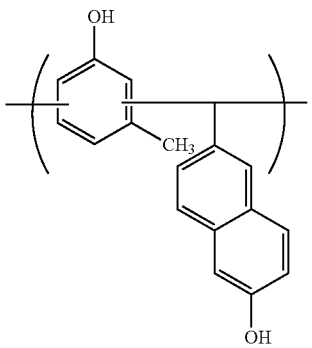

Comparative Preparation Example 3

A resin composition (A5) was prepared by dissolving 20 parts of resin (A4), 1 part of acid generator AG, 2 parts of Nicalac MW390 (Sanwa Chemical Co., Ltd.) as crosslinker, and 8 parts of carbon black in 100 parts of PGMEA containing 0.05 wt % of surfactant FC-430 (3M) and passing through a fluororesin filter with a pore size of 0.1 μm.

Preparation Example 6

Hydrogenated polystyrene base thermoplastic resin Septon® 4033 (Kuraray Co., Ltd., polystyrene-poly(ethylene/propylene)-polystyrene block copolymer, styrene content 30 wt %, hydrogenation 98%, Tg=102° C., Mw=95,000), 24 g, was dissolved in 176 g of p-menthane to form a p-menthane solution of 12 wt % Septon 4033. The resulting solution was passed through a membrane filter with a pore size of 0.2 μm, obtaining a p-menthane solution (C1) of non-silicone thermoplastic resin.

Preparation Example 7

Hydrogenated polystyrene base thermoplastic resin Septon® 8007 (Kuraray Co., Ltd., polystyrene-poly(ethylene/butylene)-polystyrene block copolymer, styrene content 30 wt %, hydrogenation 98%, Tg=111° C., Mw=90,000), 16 g, was dissolved in 184 g of p-menthane to form a p-menthane solution of 8 wt % Septon 8007. The resulting solution was passed through a membrane filter with a pore size of 0.2 pun, obtaining a p-menthane solution (C2) of non-silicone thermoplastic resin.

2) Preparation and Evaluation of Wafer Laminate

Examples 1 to 6 and Comparative Examples 1 to 3

The resin composition (A1), (A2), (A3), (A4) or (A5) was spin coated onto a glass plate (diameter 200 mm, thickness 500 pun) and baked on a hot plate at 250° C. for 5 minutes to form a coating corresponding to resin layer (A) to the thickness shown in Table 1.

There was furnished a silicon wafer (diameter 200 mm, thickness 725 pun) having copper posts (diameter 40 pun, height 10 pun) distributed over its entire surface. The p-menthane solution (C1) or (C2) was spin coated onto the copper post-bearing surface of the wafer and heated on a hot plate at 150° C. for 5 minutes to form a thermoplastic resin layer (C) to the thickness shown in Table 1.

The composition (B1), (B2) or (B3) was spin coated onto the resin layer (A) or resin layer (C) and heated on a hot plate at 150° C. for 5 minutes to form a resin layer (B) to the thickness shown in Table 1.

Using a vacuum wafer bonder EVG520IS (EV Group) under a reduced pressure of up to 0.1 Pa, the glass plate was bonded to the wafer in a combination of glass plate-resin layer (A)-resin layer (B) and resin layer (C)-wafer, or a combination of glass plate-resin layer (A) and cured resin layer (B)-resin layer (C)-wafer, with their resin layer surfaces mated together, under the bonding conditions shown in Table 1. In this way, there was obtained a wafer laminate.

The laminate was examined by the following tests. The results are shown in Table 1. The tests were carried out in the following order.

1. Adhesion Test

Using a wafer bonder EVG520IS of EV Group, a wafer with a diameter of 200 mm was bonded to a support under conditions including a bonding temperature as shown in Table 1, a chamber internal pressure of up to 0.1 Pa, and a load of 5 kN. After bonding, the laminate was heated in an oven at 180° C. for 1 hour for curing resin layer (B). After cooling to room temperature, the bond state at the interface was observed visually and under an optical microscope. The sample was evaluated poor (X) when defectives like bubbles were found at the interface, and good (0) when no defectives were found.

2. Back Surface Grinding Test

The back surface of a silicon wafer was ground by a grinder DAG810 of DISCO Co., Ltd. having a diamond abrasive wheel. After the wafer was ground to a final thickness of 50 μm, it was observed for defectives such as cracks and dislodgment under an optical microscope (100×). The sample was evaluated good (O) when no defectives were found, and poor (X) when defectives were found.

3. CVD Resistance Test

After the silicon wafer had been ground, the laminate was placed in a CVD system where a $SiO_2$ film was deposited to a thickness of 2 μm. The outer appearance of the laminate was observed for anomaly. The sample was evaluated good (O) when no appearance anomalies were found, and poor (X) when appearance anomalies (void formation, wafer bulging or wafer rupture) were found. The CVD resistance test conditions are shown below.

System: plasma-enhanced CVD PD270STL by Samco Inc.

RF 500 W

Internal pressure 40 Pa

TEOS (tetraethyl orthosilicate): $O_2$=20:680 sccm

4. Support Separation Test

The support separation ability was evaluated. Following the CVD resistance test, a dicing tape was applied to the surface of the wafer which had been thinned to 50 μm, using a dicing frame. The dicing tape was set to the chuck platen by vacuum chucking. Thereafter, laser radiation of 355 nm was irradiated over the entire surface from the support side. The sample was evaluated good (0) when the support was separated without breakage of the 50-μm wafer, and poor (X) when fissure or other anomalies occurred in the wafer.

5. Peel Test

The peel release of resin layer (B) was evaluated. Following the support separation test, a peeling tape was applied to the surface of resin layer (B) on the wafer laminate. Thereafter, by pulling up the peeling tape, the resin layer was separated at the interface between resin layer (B)

and wafer or at the interface between resin layer (B) and thermoplastic resin layer (C). The sample was evaluated good (◯) when the resin layer was separated without breakage of the 50-μm wafer, and poor (X) when fissure or other anomalies occurred in the wafer.

6. Clean-Up Test

After the peel test, cleaning with solvent was evaluated. The 200-mm wafer mounted on the dicing frame via the dicing tape (which had been exposed to the CVD resistance test conditions) was set on a spin coater, with the thermoplastic resin layer (C) upside. The cleaning test used p-menthane as cleaning fluid and included 5 minutes of spraying. Rinsing was then performed by spraying isopropyl alcohol (IPA) while spinning the wafer. The outer appearance of the wafer was visually observed for any residual resin layer (C). The sample was evaluated good (◯) in the absence of residual resin and poor (X) in the presence of residual resin.

7. Measurement of Release Force by Peeling

The p-menthane solution (C1) was spin coated on a silicon wafer and heated on a hot plate at 150° C. for 5 minutes, to form a coating of material (C1) corresponding to layer (C) to the thickness shown in Table 1. Thereafter, the composition (B1), (B2) or (B3) was spin coated onto the coating (C1) and heated on a hot plate at 150° C. for 3 minutes, to form a coating of material (B1), (B2) or (B3) corresponding to layer (B) to a thickness of 50 μm. This was heated in an oven at 180° C. for 1 hour to cure the material into layer (B).

Five strips (150 mm long×25 mm wide) of polyimide tape were attached to layer (B) on the wafer, after which the temporary adhesive layer in the open regions between the tape strips was removed. Using Autograph AG-1 (Shimadzu Corp.), the tape strip was peeled back at an angle of 180° and at a rate of 300 mm/min over a stroke of 120 mm from its one end. An average of forces required to peel (120 mm stroke, 5 strips) was computed and reported as release force of temporary bond layer (B/C).

8. Transmittance Test

Resin solution (A1), (A2), (A3), (A4) or (A5) was spin coated onto a glass plate of 500 μm thick and heat cured at 250° C. for 5 minutes to form resin layer (A) having a thickness of 0.3 μm. The transmittance of the resin layer (A) was measured by directing light of wavelength 500 nm at 5,000,000 lux. The resin layer was rated good (◯) when the transmittance was up to 20% and poor (X) when the transmittance was higher than 20%.

TABLE 1

|  | Example | | | | | | Comparative Example | | |
|---|---|---|---|---|---|---|---|---|---|
|  | 1 | 2 | 3 | 4 | 5 | 6 | 1 | 2 | 3 |
| Resin layer (A) | A1 | A2 | A3 | A3 | A3 | A3 | A4 | A3 | A3 |
| Thickness of resin layer (A), μm | 0.3 | 0.3 | 0.3 | 0.3 | 0.3 | 0.3 | 0.3 | 0.3 | 0.3 |
| Transmittance of resin layer (A) | ◯ (7%) | ◯ (12%) | ◯ (9%) | ◯ (9%) | ◯ (9%) | ◯ (9%) | X (35%) | ◯ (9%) | ◯ (9%) |
| Resin layer (B) | B1 | B1 | B1 | B2 | B2 | B2 | B2 | B3 | B2 |
| Location of resin layer (B) | on layer (C) | on layer (C) | on layer (C) | on layer (A) | on layer (C) | on layer (C) | on layer (C) | on layer (C) | on layer (C) |
| Thickness of resin layer (B), μm | 60 | 60 | 60 | 50 | 50 | 50 | 50 | 60 | 50 |
| Siloxane content in resin layer (B), wt % | 63 | 63 | 63 | 50 | 50 | 50 | 50 | 24 | 50 |
| Peeling release force of resin layer (B)/resin layer (C), gf | 10 | 10 | 10 | 20 | 20 | 20 | 20 | >100 | 20 |
| Resin modulus at 25° C. of resin layer (B), MPa | 103 | 103 | 103 | 260 | 260 | 260 | 260 | 1,100 | 260 |
| Thickness uniformity of resin layer (B), μm | <1 | <1 | <1 | <1 | <1 | <1 | <1 | <20 | <1 |
| Resin layer (C) | C1 | C1 | C1 | C1 | C1 | C2 | C1 | C1 | — |
| Thickness of resin layer (C), μm | 5 | 5 | 5 | 5 | 5 | 5 | 5 | 5 | — |
| Bonding temperature, ° C. | 110 | 110 | 110 | 120 | 120 | 120 | 120 | 160 | 120 |
| Adhesion    visual observation | ◯ | ◯ | ◯ | ◯ | ◯ | ◯ | ◯ | ◯ | ◯ |
| optical microscope | ◯ | ◯ | ◯ | ◯ | ◯ | ◯ | ◯ | ◯ | ◯ |
| Resistance to back surface grinding | ◯ | ◯ | ◯ | ◯ | ◯ | ◯ | ◯ | X | ◯ |
| CVD resistance | ◯ | ◯ | ◯ | ◯ | ◯ | ◯ | ◯ | — | ◯ |
| Support separation test | ◯ | ◯ | ◯ | ◯ | ◯ | ◯ | X | — | ◯ |
| Peel test | ◯ | ◯ | ◯ | ◯ | ◯ | ◯ | — | — | X |
| Clean-up | ◯ | ◯ | ◯ | ◯ | ◯ | ◯ | — | — | — |

As is evident from Table 1, Examples 1 to 6 within the scope of the invention provide a secure temporary bond and smooth release. In Comparative Example 1, an attempt to separate the support after laser irradiation failed and caused fissure to the wafer. In Comparative Example 2, anomalies generated during back surface grinding due to the high modulus of resin layer (B). In Comparative Example 3, resin layer (B) could not be separated by peeling because resin layer (C) was not included. In Examples 1 to 4, the wafer surface after cleaning was examined by SEM-EDX analysis, finding that metal contamination (metals: Ca, K, Na, Mg, Mn, Pb) was below the detrimental level.

Japanese Patent Application No. 2016-112828 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A wafer laminate comprising a support, an adhesive layer formed on the support, and a wafer disposed on the adhesive layer, with a circuit-forming surface of the wafer facing the adhesive layer, the adhesive layer including a resin layer (A) having light-shielding properties, a resin layer (B), and a resin layer (C) stacked on the support in an order, the resin layer (A) has a transmittance of up to 20% with respect to light of wavelength 500 nm, the resin layer (B) being a cured product of a resin composition (B) comprising a resin containing a siloxane skeleton and an epoxy group, the cured product having a resin modulus of 10 to 1000 MPa at 25 deg. C., and the resin layer (C) comprising a non-silicone thermoplastic resin.

2. The wafer laminate of claim 1 wherein the non-silicone thermoplastic resin has a glass transition temperature of −80° C. to 120° C.

3. The wafer laminate of claim 1 wherein the resin layer (A) is a cured product of a resin composition (A) comprising a resin (A) comprising repeating units of the formula (1) and having a weight average molecular weight of 500 to 500,000,

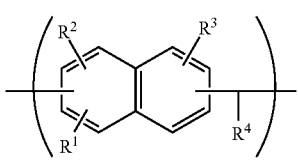

wherein $R^1$ to $R^3$ are each independently hydrogen, hydroxyl, or a $C_1$-$C_{20}$ monovalent organic group, at least one of $R^1$ to $R^3$ being hydroxyl, and $R^4$ is hydrogen or an optionally substituted $C_1$-$C_{30}$ monovalent organic group.

4. The wafer laminate of claim 3 wherein the resin composition (A) further contains a crosslinker.

5. The wafer laminate of claim 3 wherein the resin composition (A) further contains an acid generator.

6. The wafer laminate of claim 3 wherein the resin composition (A) further contains an organic solvent.

7. The wafer laminate of claim 1 wherein the resin composition (B) is a composition comprising 100 parts by weight of an epoxy-modified silicone resin comprising repeating units of the formula (2) and optionally repeating units of the formula (3), having a weight average molecular weight of 3,000 to 500,000, and 0.1 to 50 parts by weight of at least one crosslinker selected from phenol compounds having on average at least two phenol groups per molecule and epoxy compounds having on average at least two epoxy groups per molecule,

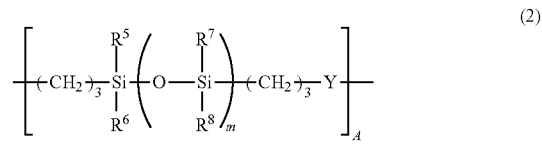

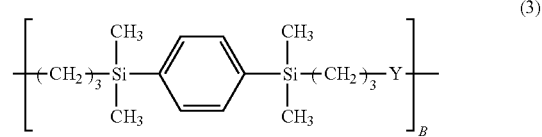

wherein $R^5$ to $R^8$ are each independently a $C_1$-$C_8$ monovalent hydrocarbon group, m is an integer of 1 to 100, A and B are numbers in the range: $0<A\leq1$, $0\leq B\leq1$, and $A+B=1$, Y is a divalent organic group having the formula (4):

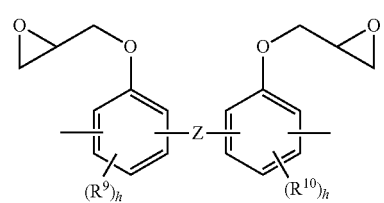

wherein Z is a single bond or a divalent organic group selected from the following:

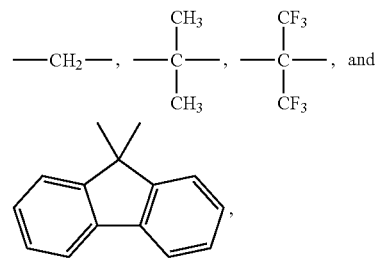

$R^9$ and $R^{10}$ each are $C_1$-$C_4$ alkyl or alkoxy, and h is 0, 1 or 2.

* * * * *